US008664643B2

(12) United States Patent
Lee et al.

(10) Patent No.: US 8,664,643 B2
(45) Date of Patent: Mar. 4, 2014

(54) ORGANIC LIGHT-EMITTING DIODE INCLUDING ELECTRON TRANSPORT LAYER AND METHOD OF MANUFACTURING THE SAME

(75) Inventors: Eun-Jung Lee, Yongin (KR); Choon-Woo Lim, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 265 days.

(21) Appl. No.: 12/903,375

(22) Filed: Oct. 13, 2010

(65) Prior Publication Data
US 2011/0084259 A1 Apr. 14, 2011

(30) Foreign Application Priority Data
Oct. 14, 2009 (KR) .................. 10-2009-0097733

(51) Int. Cl.
*H01L 29/08* (2006.01)
(52) U.S. Cl.
USPC .................................................. 257/40
(58) Field of Classification Search
USPC .................................................. 257/40
See application file for complete search history.

(56) References Cited

U.S. PATENT DOCUMENTS

| 6,566,692 B2 * | 5/2003 | Uenoyama et al. ........... 257/191 |
| 7,994,713 B2 * | 8/2011 | Yoon et al. .................... 313/506 |
| 2007/0020483 A1 * | 1/2007 | Park et al. ..................... 428/690 |
| 2009/0206744 A1 * | 8/2009 | Lim et al. ...................... 313/504 |

FOREIGN PATENT DOCUMENTS

| EP | 1603369 A1 | 12/2005 |
| EP | 1780816 A2 | 5/2007 |
| JP | 2005-093425 A | 4/2005 |
| KR | 10-2007-0013002 A | 1/2007 |

OTHER PUBLICATIONS

Extended European Search Report issued by the European Patent Office on Jan. 20, 2011, corresponding to European Patent Application No. 10186660.6.
Registration Determination Certificate issued by Korean Patent Office on Nov. 28, 2012 in the corresponding Korean application 10-2009-0097733, and Request for Entry of the Accompanying Office Action attached herewith.

* cited by examiner

Primary Examiner — Kimberly Rizkallah
Assistant Examiner — Caleb Henry
(74) Attorney, Agent, or Firm — Robert E. Bushnell, Esq.

(57) ABSTRACT

An OLED including an electron transport layer having multi-layered structure and a method of manufacturing the same, the method including simultaneously reciprocating first and second deposition sources that include different deposition materials, across a substrate.

16 Claims, 7 Drawing Sheets

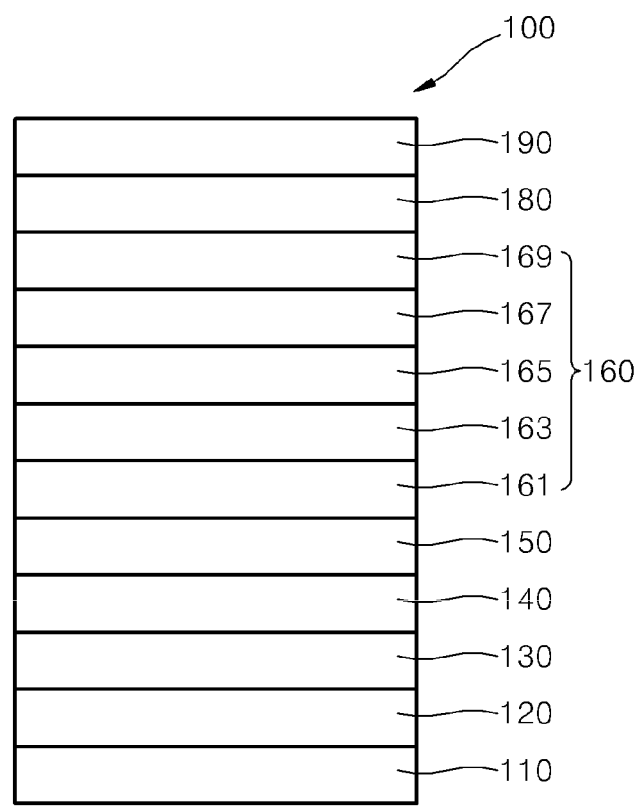

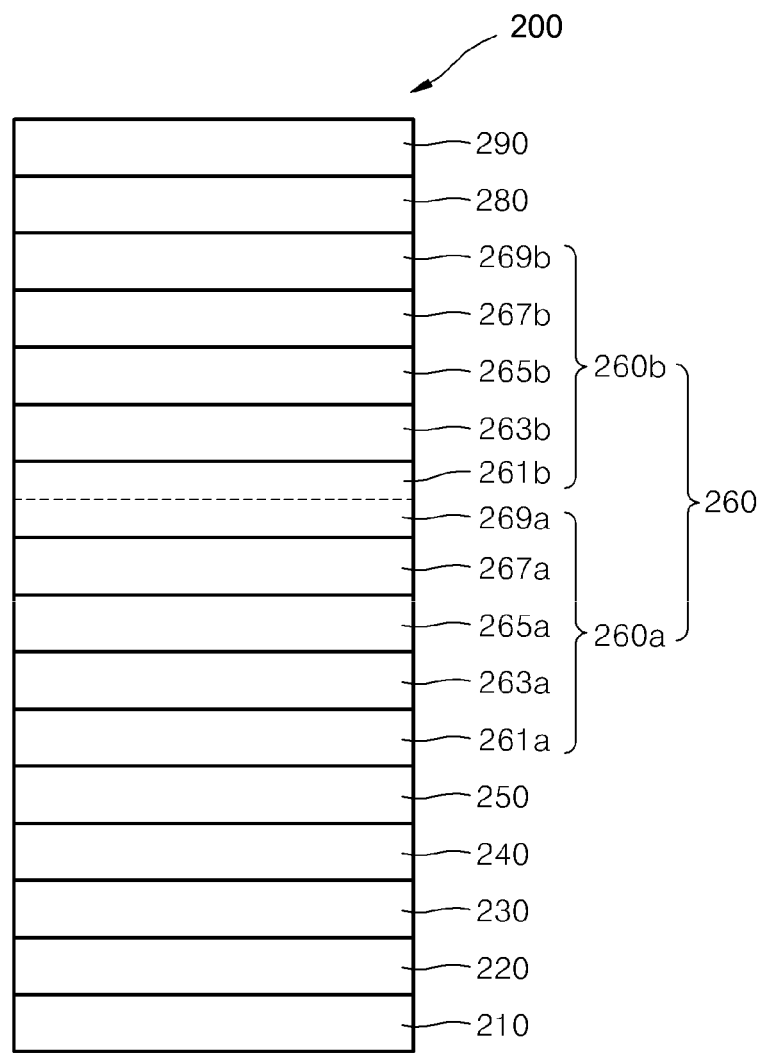

ORGANIC LIGHT-EMITTING DIODE INCLUDING ELECTRON TRANSPORT LAYER AND METHOD OF MANUFACTURING THE SAME

CROSS-REFERENCE TO RELATED APPLICATION

This application claims the benefit of Korean Patent Application No. 10-2009-0097733, filed on Oct. 14, 2009, in the Korean Intellectual Property Office, the disclosure of which is incorporated herein, by reference.

BACKGROUND

1. Field

Aspects of the present invention relate to an organic light-emitting diode (OLED) including an electron transport layer, and a method of manufacturing the same.

2. Description of the Related Art

Organic light-emitting diodes (OLEDs), which are self-emitting devices, have a wide viewing angle, excellent contrast, quick response, high brightness, excellent driving voltage characteristics, and color reproduction. A typical OLED includes an anode, a hole transport layer (HTL), an emission layer (EML), an electron transport layer (ETL), and a cathode, which are sequentially stacked on a substrate. In this regard, the HTL, the EML, and the ETL are thin films formed from organic compounds.

When a voltage is applied to the anode and the cathode, holes injected from the anode move to the EML, via the HTL, and electrons injected from the cathode move to the EML, via the ETL. The holes and electrons recombine in the EML to generate excitons. When the excitons drop from an excited state to a ground state, light is emitted. The injection and flow of holes and electrons should be balanced, so that an OLED having the above-described structure has excellent efficiency and a long lifetime.

SUMMARY

Aspects of the present invention provide a method of increasing the lifetime of an organic light-emitting diode (OLED).

According to an aspect of the present invention, there is provided an organic light-emitting diode (OLED) including: a substrate; a first electrode; a second electrode; and an electron transport layer formed between the first electrode and the second electrode. The electron transport layer includes at least one unit including: a first layer including a first material; a first mixed layer formed on the first layer and including the first material and a second material; a second layer formed on the first mixed layer and including the second material; a second mixed layer formed on the second layer and including the first material and the second material; and a third layer formed on the second mixed layer and including the first material.

According to various embodiments, the first material may include an anthracene-based material.

According to various embodiments, the second material may include a lithium (Li) complex.

According to various embodiments, the thicknesses of the first layer, the second layer, and the third layer may be each independently in the range of about 0.5 nm to about 10 nm.

According to various embodiments, the thicknesses of the first mixed layer and the second mixed layer may be each independently in the range of about 6 nm to about 16 nm.

According to various embodiments, the amount of the second material in the first mixed layer may be in the range of about 30 parts by weight to about 70 parts by weight, based on 100 parts by weight of the first mixed layer, and the amount of the second material in the second mixed layer is in the range of about 30 parts by weight to about 70 parts by weight, based on 100 parts by weight of the second mixed layer.

According to various embodiments, the second layer may include two second material-containing layers, wherein in the interface of the second material-containing layers is indistinct, such that the second layer appears to be formed of a single layer.

According to various embodiments, the OLED may further include at least one layer selected from the group consisting of a hole injection layer, a hole transport layer, an emission layer, and a hole blocking layer, formed between the first electrode and the electron transport layer.

According to various embodiments, the OLED may further include an electron injection layer formed between the electron transport layer and the second electrode.

According to various embodiments, provided is an OLED including an electron transport layer including: a first layer including a first material; a first mixed layer formed on the first layer and including the first material and a second material; a second layer formed on the first mixed layer and including the second material; a second mixed layer formed on the second layer and including the first material and the second material; a third layer formed on the second mixed layer and including the first material; a fourth layer formed on the third layer and including the first material; a third mixed layer formed on the fourth layer and including the first material and the second material; a fifth layer formed on the third mixed layer and including the second material; a fourth mixed layer formed on the fifth layer and including the first material and the second material; and a sixth layer formed on the fourth mixed layer and including the first material.

According to various embodiments, the interface between the third layer and the fourth layer may be indistinct, such that the third layer and the fourth layer appear to be a layer.

According to various embodiments, the second layer and the fifth layer may each include two second material-containing layers. The interfaces of the two second material-containing layers is indistinct, such that the second layer and the fifth layer each appear to be formed of single layers.

According to another aspect of the present invention, there is provided a method of manufacturing an organic light-emitting diode (OLED) using a first deposition source to release a first deposition material and a second deposition source to release a second deposition material, the method including: forming a first electrode on a substrate; forming an electron transport layer on the first electrode, by reciprocating the first and second deposition sources along the first electrode, while releasing the first and second deposition materials onto at least partially overlapping portions of the first electrode; and forming a second electrode on the electron transport layer.

According to various embodiments, the reciprocating of the first deposition source and the second deposition source may be performed once, twice, three times, or more.

According to various embodiments, the method may further include forming at least one selected from the group consisting of forming a hole injection layer, forming a hole transport layer, forming an emission layer, and forming a hole blocking layer, between the first electrode and the electron transport layer.

According to various embodiments, the method may further include forming an electron injection layer on the hole transport layer.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which:

FIG. 1 is a schematic sectional view of an organic light-emitting diode (OLED), according to an exemplary embodiment of the present invention;

FIG. 2 is a schematic sectional view of an OLED, according to an exemplary embodiment of the present invention;

DETAILED DESCRIPTION

Figure 3A:
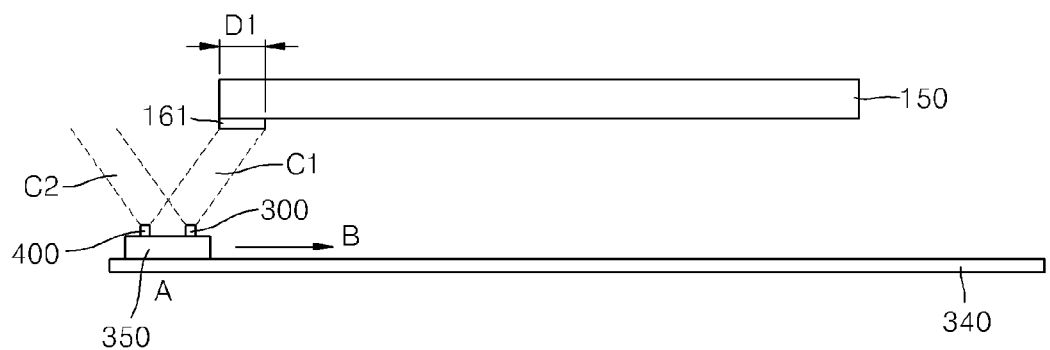
FIGS. 3A to 3G are schematic views to describe a method of manufacturing an OLED, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween.

FIG. 1 is a schematic sectional view of an organic light-emitting diode (OLED) 100, according to an exemplary embodiment of the present invention. Referring to FIG. 1, the OLED 100 includes a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190.

The ETL 160 includes a first layer 161 including a first material, a first mixed layer 163 formed on the first layer 161 and including the first material and a second material, a second layer 165 formed on the first mixed layer 163 and including the second material, a second mixed layer 167 formed on the second layer 165 and including the first material and the second material, and a third layer 169 formed on the second mixed layer 167 and including the first material. The first layer 161 may be formed directly on the EML 150.

The substrate 110 may be any substrate that is commonly used in manufacturing organic light-emitting diodes. For example, the substrate 110 may be a glass substrate or a transparent plastic substrate, having excellent mechanical strength, thermal stability, transparency, surface smoothness, ease of handling, and waterproofness.

The first electrode 120 may be formed on the substrate 110 by depositing or sputtering a material that is used to form the first electrode 120. The first electrode 120 may be an anode.

When the first electrode 120 constitutes an anode, the material used to form the first electrode 120 may be a high work-function material, so as to facilitate hole injection. The first electrode 120 may be a transparent or reflective electrode. Transparent conductive materials, such as indium tin oxide (ITO), indium zinc oxide (IZO), tin-dioxide ($SnO_2$), and zinc oxide (ZnO), may be used to form the first electrode 120. The first electrode 120 may also be formed using magnesium (Mg), aluminum (Al), aluminum-lithium (Al—Li), calcium (Ca), magnesium-indium (Mg—In), magnesium-silver (Mg—Ag), or the like.

The HIL 130 may be formed on the first electrode 120 by vacuum deposition, spin coating, casting, Langmuir-Blodgett (LB) deposition, or the like. When the HIL 130 is formed using vacuum deposition, the deposition conditions may vary according to a compound that is used to form the HIL 130, and the desired structure and thermal properties of the HIL 130. In general, however, conditions for vacuum deposition may include a deposition temperature of 100 to 500° C., a pressure of $10^{-8}$ to $10^{-3}$ torr, and a deposition rate of 0.01 to 100 Å/sec.

When the HIL 130 is formed using spin coating, coating conditions may vary according to a compound that is used to form the HIL 130, and the desired structure and thermal properties of the HIL 130. For example, the coating conditions may include a coating speed of about 2000 rpm to about 5000 rpm, and a thermal treatment temperature of about 80° C. to about 200° C. The thermal treatment removes a solvent after the coating is performed.

The HIL 130 may be formed of any material that is commonly used to form an HIL. Examples of materials that may be used to form the HIL 130 include a phthalocyanine compound, such as copperphthalocyanine, 4,4',4"-tris (3-methyiphenylphenylamino) triphenylamine (m-MTDATA), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), and polyaniline)/poly(4-styrene-sulfonate (PANI/PSS), but are not limited thereto.

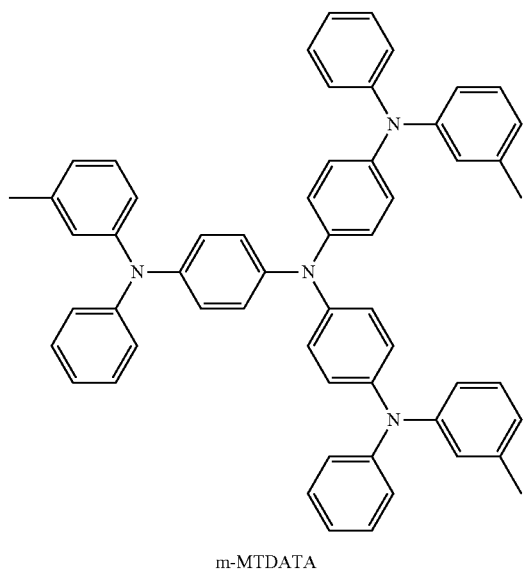

m-MTDATA

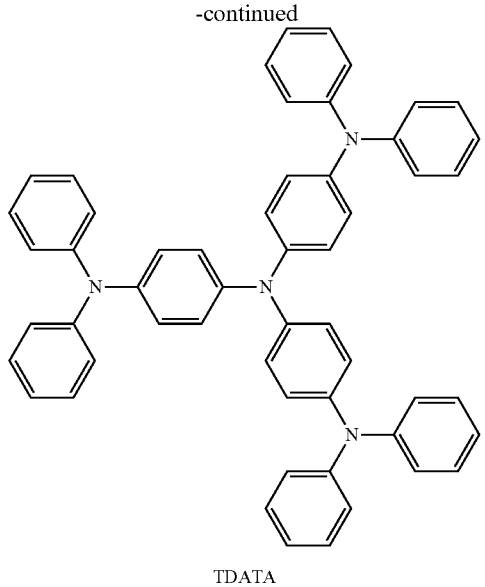

TDATA

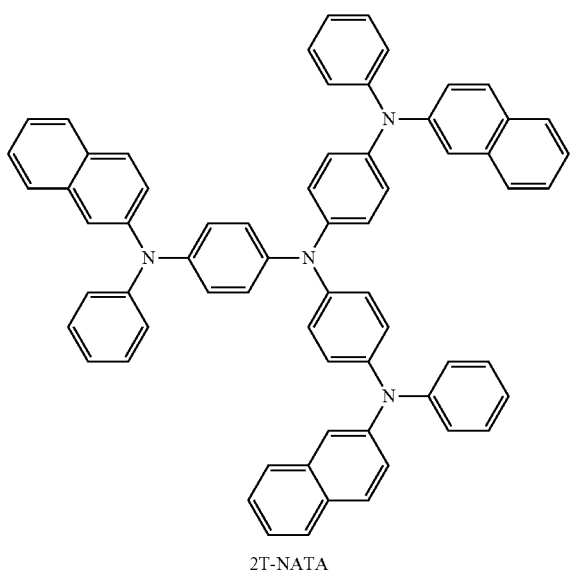

2T-NATA

The thickness of the HIL 130 may be in the range of about 100 Å to 10000 Å, and for example, about 100 Å to 1000 Å. When the thickness of the HIL 130 is within this range, the HIL 130 may have excellent hole injecting characteristics, without a substantial increase in driving voltage.

The HTL 140 may be formed on the HIL 130 by vacuum deposition, spin coating, casting, Langmuir-Blodgett (LB) deposition, or the like. When the HTL 140 is formed by vacuum deposition or spin coating, the conditions for deposition and coating may be similar to those for the formation of the HIL 130. However, the conditions for the deposition and coating may vary, according to the material that is used to form the HTL 140.

The HTL 140 may be formed of any material that is commonly used to form a HTL. Examples of the material that may be used to form the HTL 140 are: a carbazole derivative, such as N-phenylcarbazole or polyvinylcarbazole; an amine derivative having an aromatic condensation ring, such as N,N'-bis(3-methylphenyl)-N,N'-diphenyl-[1,1-biphenyl]-4,4'-diamine (TPD), or N,N'-di(naphthalene-1-yl)-N,N'-diphenyl benzydine (α-NPD); and a triphenylamine-based material, such as 4,4',4"-tris(N-carbazolyl)triphenylamine (TCTA). Among these materials, TCTA can transport holes and inhibit excitons from being diffused into the EML.

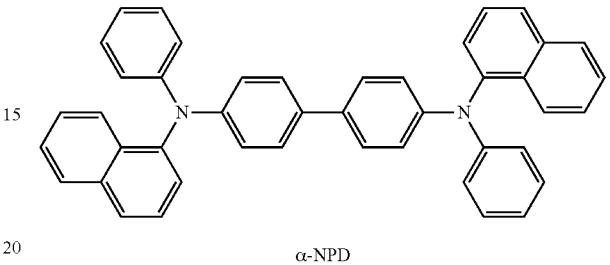

α-NPD

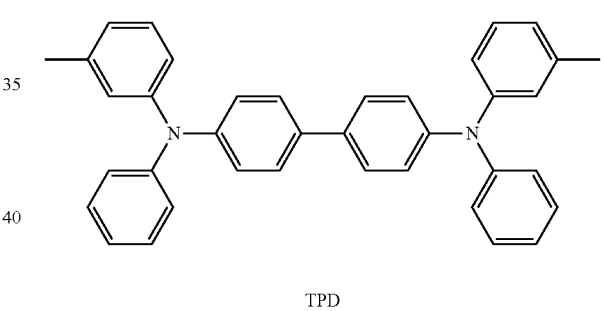

TPD

The thickness of the HTL 140 may be in the range of about 50 Å to 1000 Å and, for example, about 100 Å to 800 Å. When the thickness of the HTL 140 is within this range, the HTL 140 may have excellent hole transporting characteristics, without a substantial increase in driving voltage.

The EML 150 may be formed on the HTL 140 by vacuum deposition, spin coating, casting, LB, or the like. When the EML 150 is formed using vacuum deposition or spin coating, the conditions for deposition and coating may be similar to those for the formation of the HIL 130. However, the conditions for deposition and coating may vary, according to the material that is used to form the EML 150.

The EML 150 may be formed of a combination of a host and a dopant. Example of the host are $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), AND, Bis(2-(2-hydroxyphenyl)benzothiazolate)zinc ($Zn(BTZ)_2$), Compound 1 below, and Compound 2 below, but are not limited thereto.

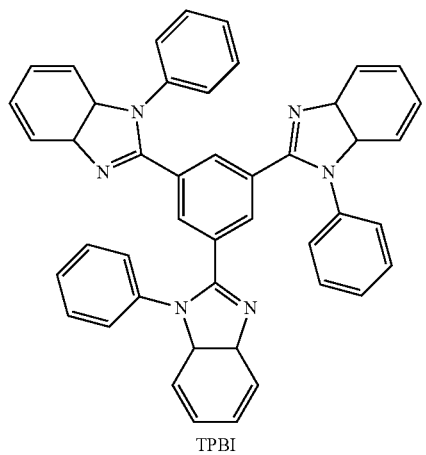
TPBI
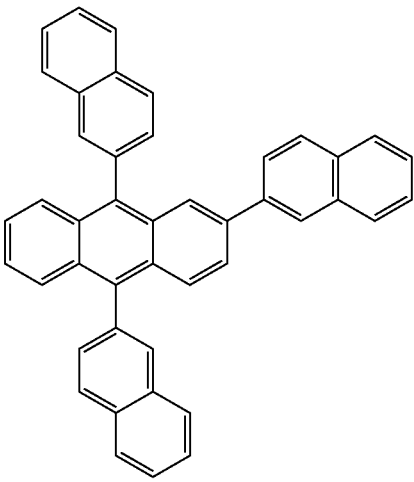
Compound 1
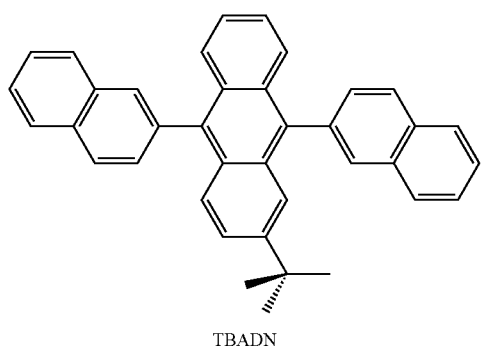
TBADN
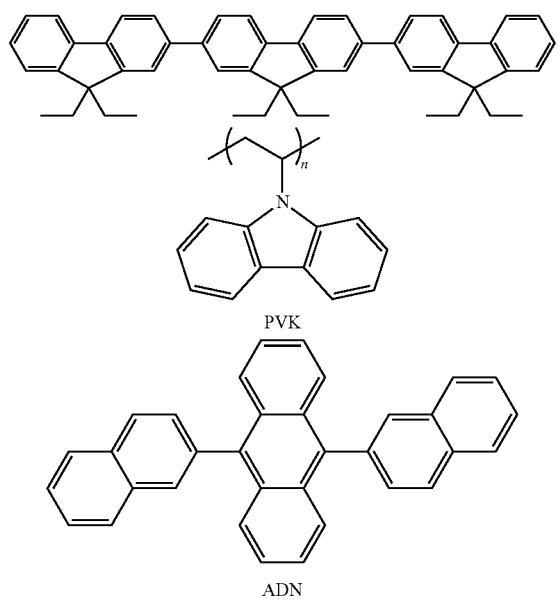
Compound 2
Examples of a red dopant are PtOEP, Ir(piq)$_3$, and Btp$_2$Ir(acac), but are not limited thereto.
PVK
ADN
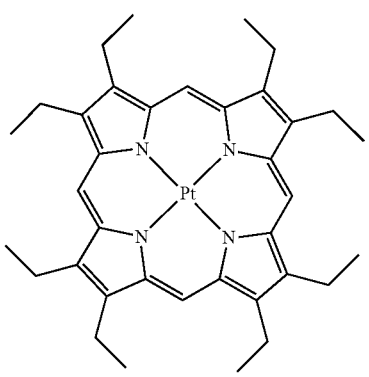
PtOEP
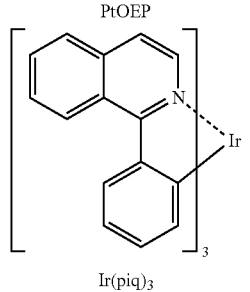
Ir(piq)$_3$

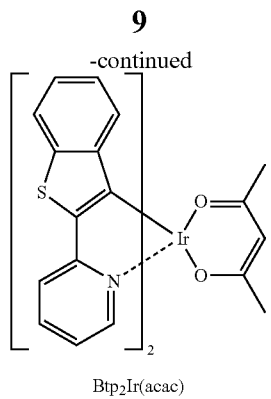

Btp₂Ir(acac)

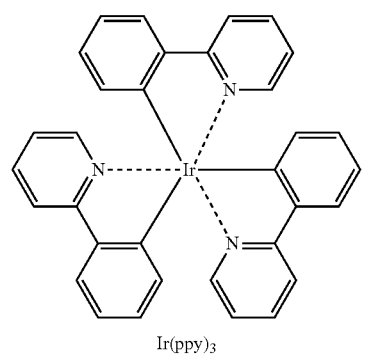

Ir(ppy)₂(acac)        Ir(mpyp)₃

Examples of a green dopant are Ir(ppy)₃ (ppy=phenylpyridine), Ir(ppy)₂(acac), Ir(mpyp)₃, and Compound 3 below, but are not limited thereto.

Compound 3

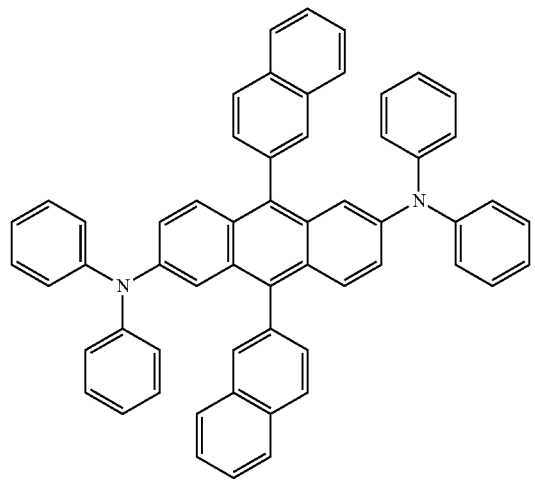

Ir(ppy)₃

Examples of a blue dopant are F₂Irpic, (F₂ppy)₂Ir(tmd), Ir(dfppz)₃, ter-fluorene, 4,4'-bis(4-diphenyl amiostyryl)biphenyl (DPAVBi), 2,5,8,11-tetra-tert-butyl perylene (TBPe), and Compound 4 below, but are not limited thereto.

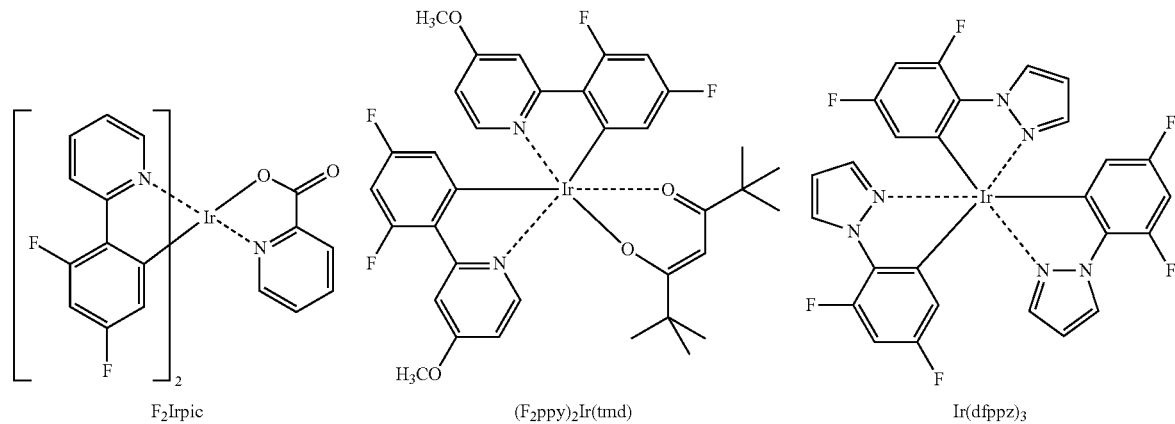

F₂Irpic        (F₂ppy)₂Ir(tmd)        Ir(dfppz)₃

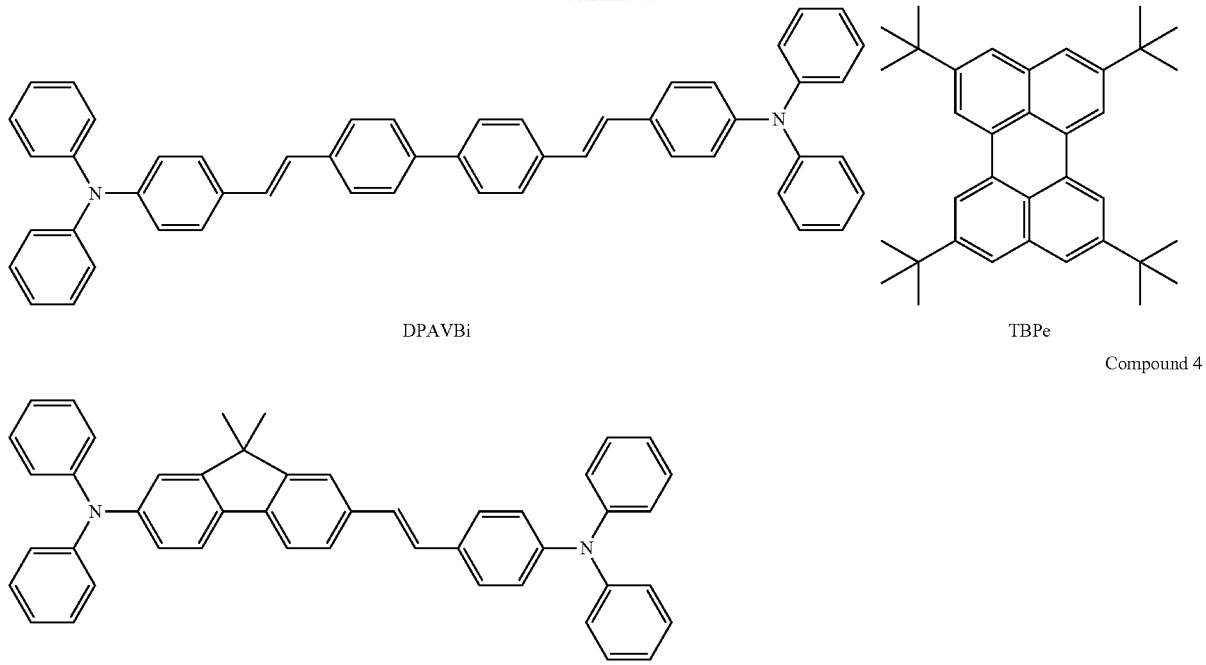

DPAVBi

TBPe

Compound 4

The amount of the dopant may be in the range of about 0.01 to about 15 parts by weight, based on 100 parts by weight of the host, but is not limited thereto. The EML 150 may have a thickness of about 100 Å to about 1,000 Å, for example, about 200 Å to about 600 Å. When the thickness of the EML 150 is within this range, the EML 150 may have excellent light emission, without a substantial increase in driving voltage.

When a phosphorescent dopant is also used to form the EML 150, a hole blocking layer (HBL) (not shown) may be formed on the EML 150, by using vacuum deposition, spin coating, casting, LB deposition, or the like, in order to prevent the diffusion of triplet excitons or holes into the ETL 160. When the HBL is formed using vacuum deposition or spin coating, the conditions for deposition and coating may be similar to those for the formation of the HIL 130. However, the conditions for deposition and coating may vary, according to the material that is used to form the HBL. Any material that is commonly used to form a HBL may be used. Examples of materials for forming the HBL include an oxadiazole derivative, a triazole derivative, and a phenanthroline derivative, but are not limited thereto.

The HBL may have a thickness of about 50 Å to about 1,000 Å, for example, about 100 Å to about 300 Å. When the thickness of the HBL is within this range, the HBL may have excellent hole-blocking properties, without a substantial increase in driving voltage.

The ETL 160 may be formed on the EML 150 or on the HBL if the HBL is formed. The ETL 160 includes a first layer 161 including a first material, a first mixed layer 163 formed on the first layer 161 and including the first material and a second material, a second layer 165 formed on the first mixed layer 163 and including the second material, a second mixed layer 167 formed on the second layer 165 and including the first material and the second material, and a third layer 169 formed on the second mixed layer 167 and including the first material. The first layer 161, the first mixed layer 163, the second layer 165, the second mixed layer 167, and the third layer 169 may be referred to as a unit.

The ETL 160 has a stacked structure, so that injection and transport of electrons may be balanced and holes may be efficiently blocked. In a conventional OLED, since the amounts of electrons and holes vary with time, after driving is initiated, the number of excitons generated in an emission area may be reduced. As a result, a carrier balance may not be maintained, so as to reduce the lifetime of the OLED.

However, in the ETL 160, the first layer 161, the first mixed layer 163, the second layer 165, the second mixed layer 167, and the third layer 169 have similar or identical energy levels, so that the carrier balance may be uniformly maintained, while controlling an electron-transfer rate. Thus, the lifetime characteristics of the OLED 100 are improved.

The first material may be a material that efficiently transports electrons, such as an anthracene-based material. For example, the first material may be selected from the group consisting of Compound 5, a compound represented by Formula 1, and a compound represented by Formula 2 below:

Compound 5

Formula 1

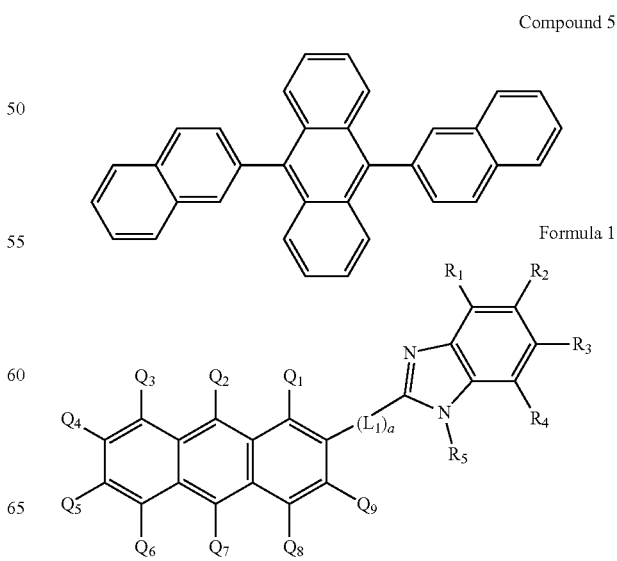

Formula 2

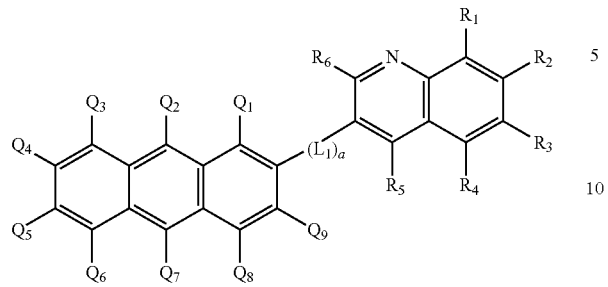

In Formulae 1 and 2, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent $R_1$ to $R_6$ groups are optionally bonded to each other, to form a saturated or unsaturated ring. $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group. $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and "a" is an integer from 1 to 10.

For example, $R_1$ to $R_6$ may be each independently selected from the group consisting of a hydrogen atom, a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group, but are not limited thereto.

In particular, in Formula 1, $R_1$ to $R_4$ may each be a hydrogen atom, $R_5$ may be selected from the group consisting of a halogen atom, a hydroxy group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group, but are not limited thereto. In addition, in Formula 2, $R_1$ to $R_6$ may each be a hydrogen atom, but are not limited thereto.

For example, $Q_1$ to $Q_9$ are each independently a hydrogen atom, a phenyl group, a naphthyl group, an anthryl group, a pyridinyl group, and a pyrazinyl group, but are not limited thereto. In particular, in Formulae 1 and 2, $Q_1$, $Q_3$-$Q_6$, $Q_8$ and $Q_9$ are hydrogen atoms, and $Q_2$ and $Q_7$ may be each independently selected from the group consisting of a phenyl group, a naphthyl group, an anthryl group, a pyridinyl group, and a pyrazinyl group, but are not limited thereto.

For example, $L_1$ may be selected from the group consisting of a phenylene group, a naphthylene group, an anthrylene group, a pyridinylene group, and a pyrazinylene group, but are not limited thereto. In particular, $L_1$ may be a phenylene group or a pyridinylene group. For example, "a" may be 1, 2, or 3, but is not limited thereto.

The first material may be Compound 5, 6, or 7 below:

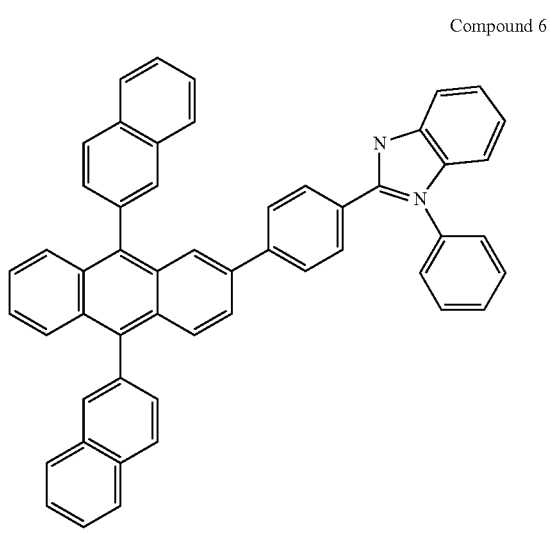

Compound 6

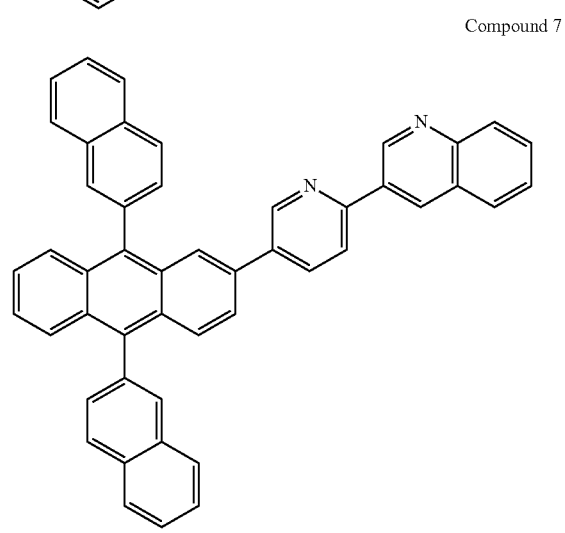

Compound 7

The second material may inject electrons and block holes. The second material may be a lithium (Li) complex. For example, the second material may be lithium quinolate (LiQ) or Compound 8 below, but is not limited thereto:

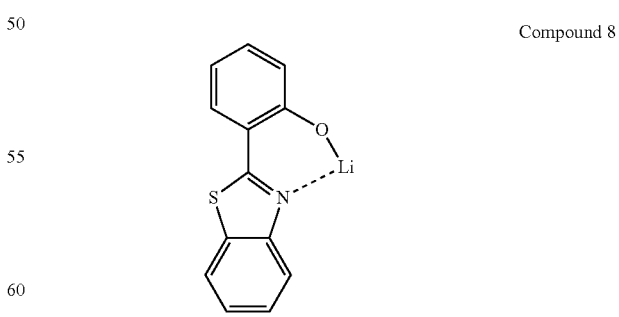

Compound 8

The thicknesses of the first layer 161, the second layer 165, and the third layer 169 may be each independently in the range of about 0.5 nm to about 10 nm, for example, about 0.5 nm to about 6 nm. When the thicknesses of the first layer 161, the second layer 165, and the third layer 169 are within this range, the layers 161, 165, 169 may effectively inject and transport electrons, without a substantial increase in driving voltage. The layers 161, 165, 169 may have the same or different thicknesses.

The thicknesses of the first mixed layer 163 and the second mixed layer 167 may be each independently in the range of about 6 nm to about 16 nm, for example, about 6 nm to about 10 nm. When the thicknesses of the first mixed layer 163 and the second mixed layer 167 are within this range, the mixed layers 163, 167 may effectively inject and transport electrons, without a substantial increase in driving voltage. The mixed layers 163, 167 may have the same or different thicknesses.

The amount of the second material in the first mixed layer 163 may be in the range of about 30 parts by weight to about 70 parts by weight, for example, about 45 parts by weight about 55 parts by weight, based on 100 parts by weight of the first mixed layer 163. In addition, the amount of the second material in the second mixed layer 167 may be in the range of about 30 parts by weight to about 70 parts by weight, for example, about 45 parts by weight about 55 parts by weight, based on 100 parts by weight of the second mixed layer 167. If the amount of the second material in the first mixed layer 163 and the second mixed layer 167 is within the ranges described above, excellent efficiency may be achieved.

The ETL 160 may be formed on the EML 150 by vacuum deposition, spin coating, casting, or the like. When the ETL 160 is formed by vacuum deposition or spin coating, the deposition and coating conditions may be similar to those for formation of the HIL 130. However, the deposition and coating conditions may vary, according to a compound that is used to form the ETL 160.

Using vacuum deposition, the ETL 160 may be formed using a first deposition source to deposit a first material in a first deposition region, and a second deposition source to deposit a second material in a second deposition region. The first deposition source and the second deposition source are positioned relative to one another, such that a first overlap region is formed where the first deposition region and the second deposition region overlap each other. The first deposition source and the second deposition source are reciprocated between a first end and a second end of the EML 150.

FIGS. 3A to 3G are schematic views to describe a method of forming the ETL 160 on the EML 150, according to an exemplary embodiment of the present invention. In FIGS. 3A to 3G, the substrate 110, the first electrode 120, the HIL 130, and the HTL 140 are not shown, for convenience, but are present.

In FIG. 3A, the first deposition source 300 and the second deposition source 400 are disposed below a surface of the EML 150, on which the HIL 130 and the HTL 140 are not formed. The first deposition source 300 releases the first material in a pattern C1, and the second deposition source 400 releases the second material in a pattern C2. The patterns C1 and C2 may be fan-shaped, as shown in FIG. 3A.

The first deposition source 300 and the second deposition source 400 are spaced apart from each other, such that the patterns C1 and C2 at least partially overlap each other. Accordingly, the first material and the second material may be simultaneously deposited in the overlapped region, to form a mixed layer including the first and second materials, as shown in FIG. 3B.

The first deposition source 300 and the second deposition source 400 may be fixed on a base 350. The base 350 may be positioned on a guide rail 340 installed in a chamber, so that the base 350 may reciprocate along the guide rail 340. The base 350 may be connected to a drive unit (not shown).

As described above, the base 350, to which the first deposition source 300 and the second deposition source 400 are fixed, moves from a first end A of the guide rail 340, which is below a first end of the EML 150, in the B direction, when the first and second deposition sources 300 and 400 are turned on, as shown in FIG. 3A. In this regard, the deposition of the first material on the EML 150 forms the first layer 161 on a portion D1 of the EML 150. The deposition of the first layer 161 continues as the base 350 moves in the B direction.

Figure 3B:
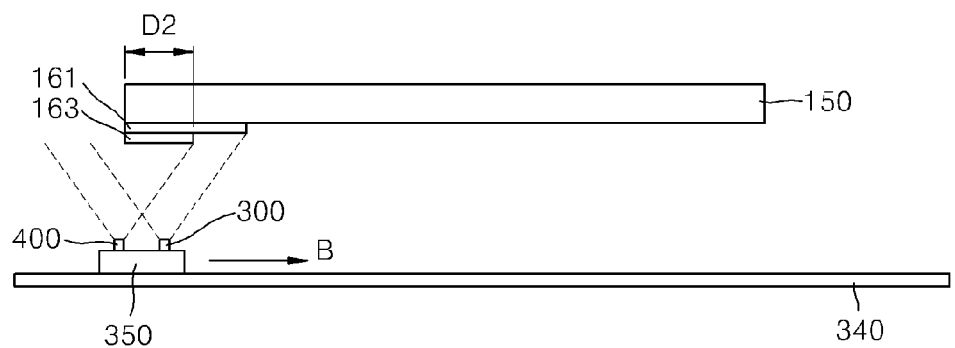

As shown in FIG. 3B, the base 350 continues moving in the B direction, such that the first material and the second material are simultaneously deposited in a region (D2), thereby forming a portion of the first mixed layer 163.

Figure 3C:
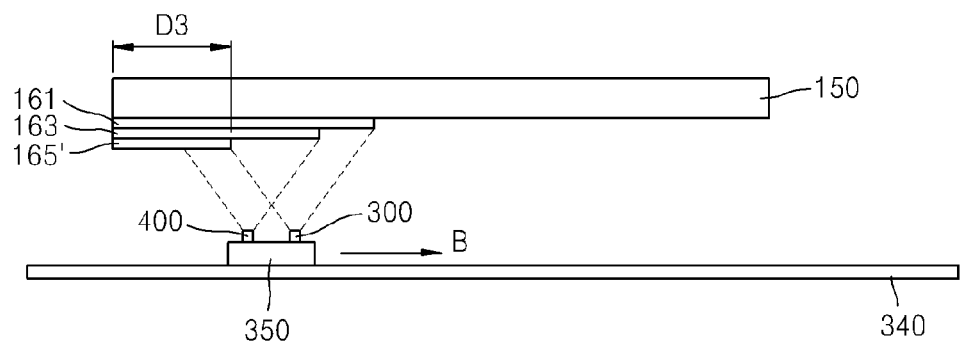
Figure 3D:
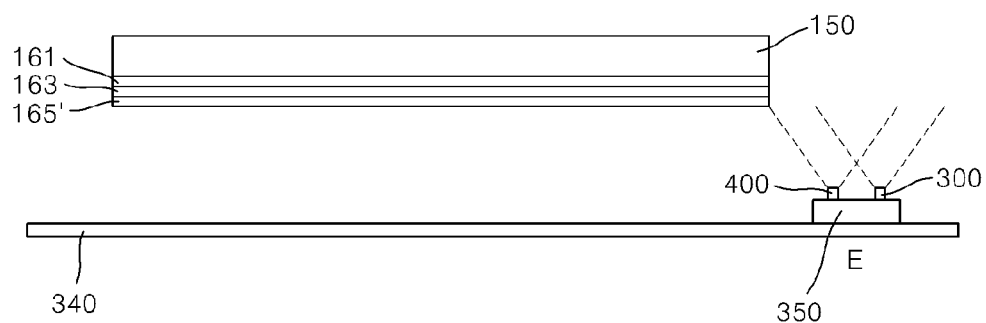
Figure 3E:
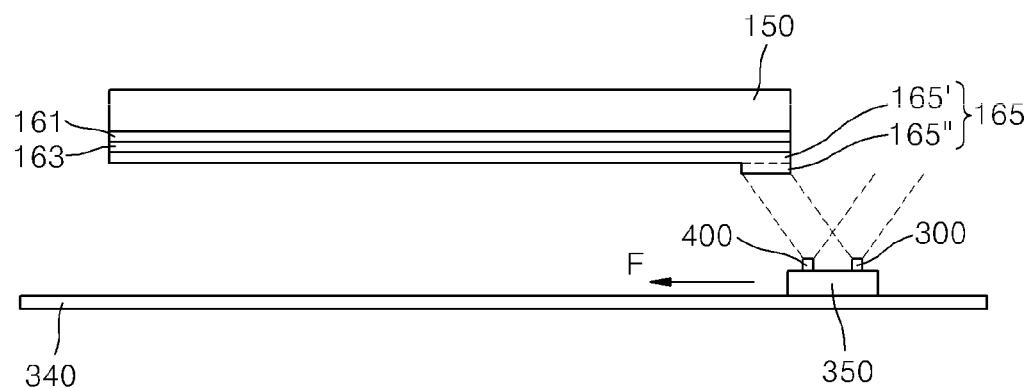

As shown in FIG. 3C, as the base 350 continues moving in the B direction, a portion of a second material-containing layer 165' is formed in a region D3. As shown in FIG. 3D, once the base 350 reaches a second end E of the EML 150, the formation of the layers 161, 163, 165' is completed. As shown in FIG. 3E, the base 350 then starts to move in the F direction that is opposite to the B direction. Accordingly, the formation of a second material-containing layer 165" is initiated.

Figure 3F:
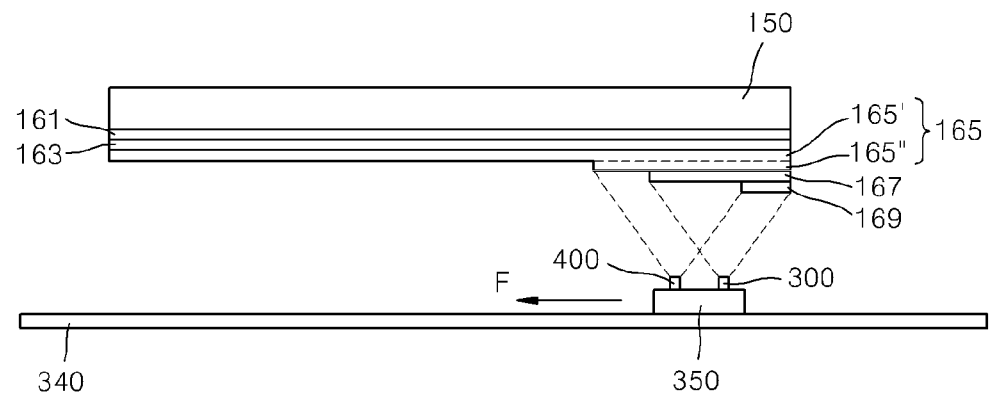

As shown in FIG. 3F, as the base 350 moves in the F direction, the second mixed layer 167, including the first material and the second material, and the third layer 169, including the second material, may be sequentially formed on the second layer 165. Since the components of the second material-containing layer 165' and the second material-containing layer 165" are the same: the interface therebetween is indistinct, so that they may appear to be a single layer. In consideration of this, the interface between the second material-containing layer 165' and the second material-containing layer 165" is illustrated with dotted lines instead of solid lines. Thus, the second material-containing layer 165' and the second material-containing layer 165" may be referred to as a single layer, i.e., the second layer 165.

Figure 3G:
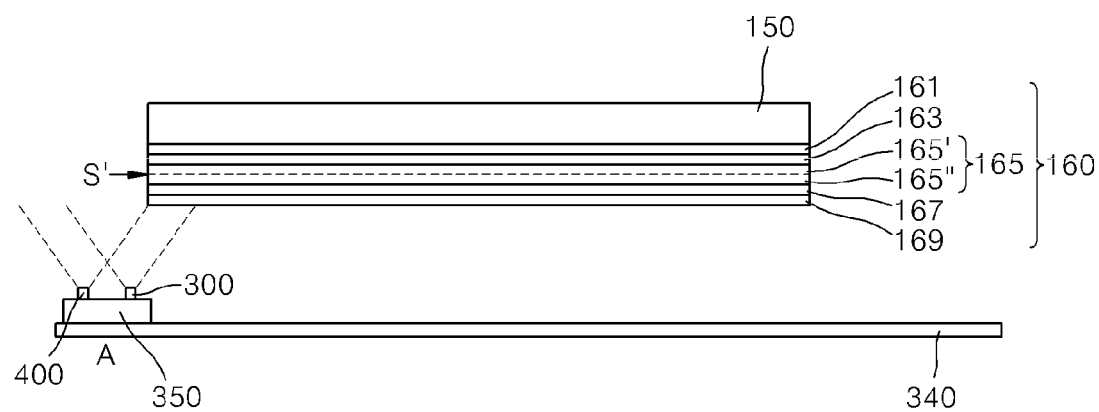

As shown in FIG. 3G, the base 350 reaches the first end A of the rail 340, thereby completing the formation of the ETL 160 on the EML 150. In this regard, even though the second layer 165 includes layers 165' and 165", the interface S' therebetween is indistinct, as illustrated by the dotted lines.

According to the method of forming the ETL 160 as described above, the ETL 160 may be formed by reciprocating the base 350, to which the first deposition source 300 and the second deposition source 400 are fixed, from the first end A to the second end E of the rail 340. That is, a unit of an ETL 160 may be formed using the method of FIGS. 3A to 3G. Thus, the stacking process is more simply and quickly performed, as compared to prior methods. In particular, since a plurality of layers may be almost simultaneously deposited in a single chamber, the chamber is not required to be exhausted after the formation of each layer.

The EIL 180, which facilitates injection of electrons from the cathode, may be formed on the ETL 160. Examples of materials for forming the EIL 180 include LiF, NaCl, CsF, $Li_2O$, and BaO, which are known in the art. Deposition and coating conditions for forming the EIL 180 are similar to those for formation of the HIL 130, although the deposition and coating conditions may vary, according to a material that is used to form the EIL 180.

The thickness of the EIL 180 may be in the range of about 1 to 100 Å, for example, in the range of 5 to 90 Å. When the thickness of the EIL 180 is within this range, the EIL 180 may have satisfactory electron-injecting properties, without a substantial increase in driving voltage.

The second electrode 190 is formed on the EIL 180. The second electrode 190 may be a cathode, which is an electron-injecting electrode. The second electrode 190 may be formed of a metal, an alloy, an electrically conductive compound, or a mixture thereof. The second electrode 190 may have a low-work function. For example, the second electrode 190 may be formed of lithium (Li), magnesium (Mg), aluminum (Al), aluminum (Al)-lithium (Li), calcium (Ca), magnesium (Mg)-indium (In), magnesium (Mg)-silver (Ag), or the like. In addition, the second electrode 190 may be formed of a transparent conductive material, such as ITO or IZO.

Since the layers of the ETL 160 have similar or identical energy levels, the injection and transport of the electrons may be controlled, and the holes may be efficiently blocked. Thus, the OLED 100 may have long lifetime.

FIG. 2 is a schematic sectional view of an OLED 200, according to another exemplary embodiment of the present invention. Referring to FIG. 2, the OLED 200 includes a substrate 210, a first electrode 220, a HIL 230, a HTL 240, an EML 250, an ETL 260, an EIL 280, and a second electrode 290. The ETL 260 includes a first unit 260a and a second unit 260b.

The first unit 260a includes a first layer 261a including a first material, a first mixed layer 263a formed on the first layer 261a and including the first material and a second material, a second layer 265a formed on the first mixed layer 263a and including the second material, a second mixed layer 267a formed on the second layer 265a and including the first material and the second material, and a third layer 269a formed on the second mixed layer 267a and including the first material.

The second unit 260b includes a fourth layer 261b including a first material, a third mixed layer 263b formed on the fourth layer 261b and including the first material and a second material, a fifth layer 265b formed on the third mixed layer 263b and including the second material, a fourth mixed layer 267b formed on the fifth layer 265b and including the first material and the second material, and a sixth layer 269b formed on the fourth mixed layer 267b and including the first material.

The layers of the ETL 260 have similar or identical energy levels, so that the injection and transport of the electrons may be controlled, and the holes may be efficiently blocked. Thus, the OLED 200 may have long lifetime.

The layers of the first unit 260a and the second unit 260b are similar to the corresponding layers described above, with reference to FIG. 1. The ETL 260 may be formed by repeating the method of FIGS. 3A to 3G. That is, the ETL 260 may be formed by reciprocating the first deposition source 300 and the second deposition source 400 twice along the guide rail 340.

The interface between the third layer 269a and the fourth layer 261b is indistinct, such that the third layer 269a and the fourth layer 261b may appear to be a single layer. Thus, the interface between the third layer 269a and the fourth layer 261b is shown with dotted lines in FIG. 2. Referring to FIGS. 3E, 3F, and 3G, the third layer 269a and the fourth layer 261b may appear to be a single layer.

The second layer 265a and the fifth layer 265b may respectively include two second material-containing layers. Since the interface of the two second material-containing layers is indistinct, the second layer 265a and the fifth layer 265b may appear to be a single layer.

The substrate 210, the first electrode 220, the hole injection layer 230, the hole transport layer 240, the emission layer 250, and the electron injection layer 280 of the OLED 200 are similar to corresponding elements described with reference to FIG. 1. Even though the structure of the OLED 200 and the method of manufacturing the OLED 200 are described with reference to FIGS. 1, 2, and 3A to 3G, the scope of the present invention is not limited thereto. For example, the ETL 260 may include three or more units.

While not shown, a sealing layer may further be formed on the second electrodes 190, 290, in order to seal the OLEDs 100, 200. In addition, various other modifications may be applied thereto.

Hereinafter, one or more exemplary embodiments of the present invention will be described in detail with, reference to the following examples. However, these examples are not intended to limit the purpose and scope of the one or more exemplary embodiments of the present invention.

EXAMPLES

Example 1

A 15 Ω/cm² (1200 Å) ITO glass substrate (available from Corning Co.) was cut to a size of 50 mm×50 mm×0.7 mm, ultrasonically washed with isopropyl alcohol for 5 minutes and then with pure water for 5 minutes, and washed again with UV ozone for 30 minutes, to prepare a first electrode. Then, m-MTDATA was vacuum deposited on the ITO electrode, to form a HIL having a thickness of 750 Å. Then α-NPD was vacuum deposited on the HIL, to form a HTL having a thickness of 150 Å. 92 wt % of as a host and 8 wt % of as a dopant were deposited on the HTL, to form a red EML with a thickness of 300 Å.

Then, an ETL was formed using Compound 7 as the first material and LiQ as the second material by performing the method described with reference to FIGS. 3A to 3G twice, i.e., twice reciprocating deposition sources. The ETL included: a first layer including Compound 7 and having a thickness of 5 Å; a first mixed layer including Compound 7 and LiQ and having a thickness of 82 Å; a second layer including LiQ and having a thickness of 10 Å; a second mixed layer including Compound 7 and LiQ, and having a thickness of 82 Å; a third layer including Compound 7 having a thickness of 5 Å; and a fourth layer including Compound 7 and having a thickness of 5 Å; a third mixed layer including Compound 7 and LiQ, and having a thickness of 82 Å; a fifth layer including LiQ and having a thickness of 10 Å; a fourth mixed layer including Compound 7 and LiQ, and having a thickness of 82 Å; and a sixth layer including Compound 7 and having a thickness of 5 Å.

Since the second and fifth layers may each be formed of the LiQ layers 165' and 165" having thicknesses of 5 Å, which are sequentially formed, the interface S' therebetween may not be identified, as shown in FIG. 3G. Since the interface between the third layer and the fourth layer may not be clearly defined, a single layer having a thickness of 10 Å may be observed.

LiF was vacuum deposited on the ETL, to form an EIL having a thickness of 80 Å. Al was vacuum deposited on the EIL, to form a second electrode having a thickness of 1000 Å.

Comparative Example A

An OLED was manufactured in the same manner as in Example 1, except that an ETL was formed on the red EML, by co-depositing Compound 7 and LiQ at a 1:1 ratio, to a thickness of 37 nm.

Example 2

An OLED was manufactured in the same manner as in Example 1, except that a green EML was formed using 97 wt % of Compound 1 as a host and 3 wt % of Compound 3 as a dopant.

Comparative Example B

An OLED was manufactured in the same manner as in Example 2, except that an ETL was formed on the green EML, by co-depositing Compound 7 and LiQ at a 1:1 ratio, to a thickness of 37 nm.

Example 3

An OLED was manufactured in the same manner as in Example 1, except that a blue EML was formed using 95 wt % of Compound 2 as a host and 4 wt % of Compound 4 as a dopant.

Comparative Example C

An OLED was manufactured in the same manner as in Example 2, except that an ETL was formed on the blue EML, by co-depositing Compound 7 and LiQ at a 1:1 ratio, to a thickness of 37 nm.

Evaluation Example 1

Figure 4:
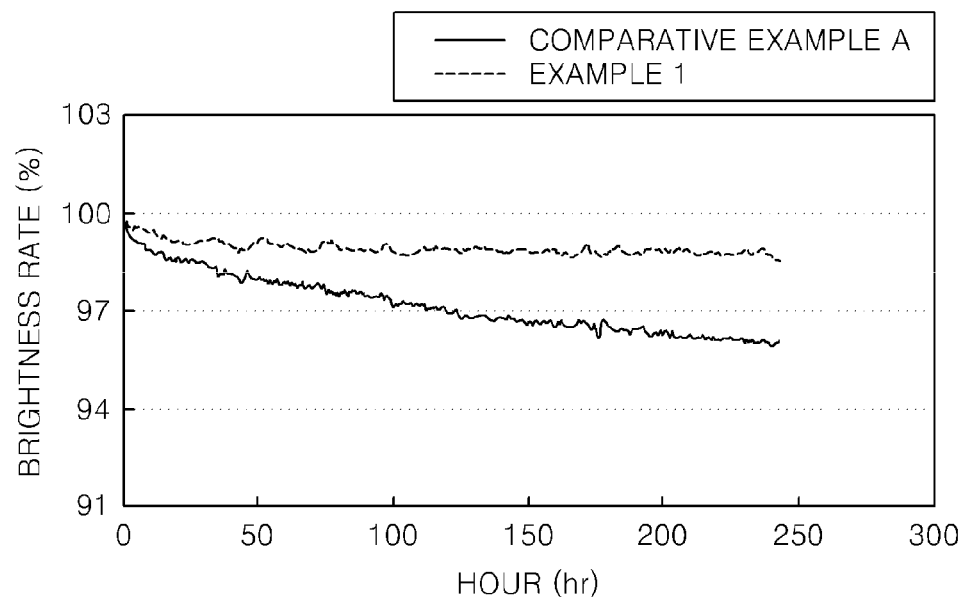
FIGS. 4 to 6 are graphs illustrating the brightness of OLEDs with respect to time, according to exemplary embodiments of the present invention and comparative examples.
Figure 5:
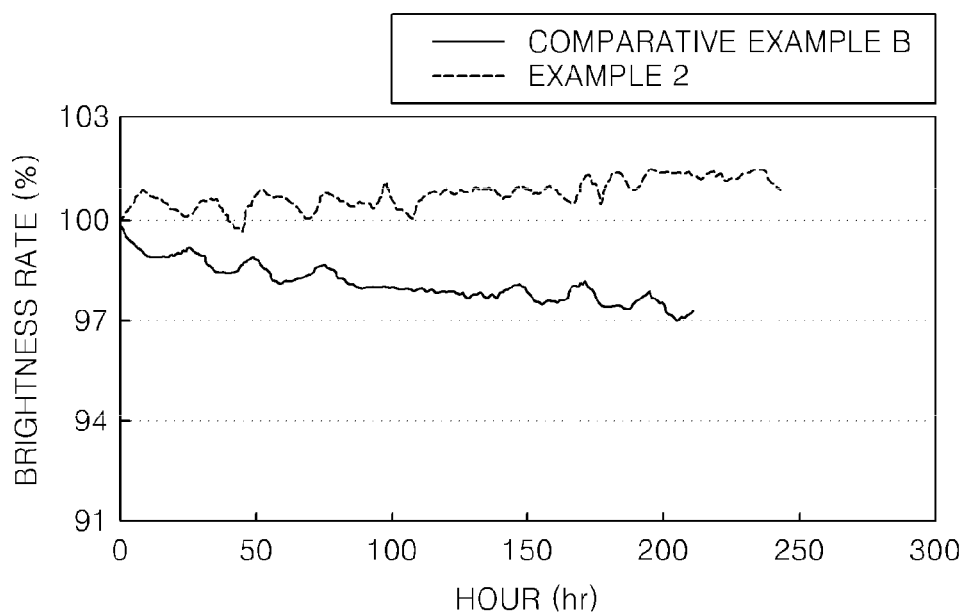
Figure 6:
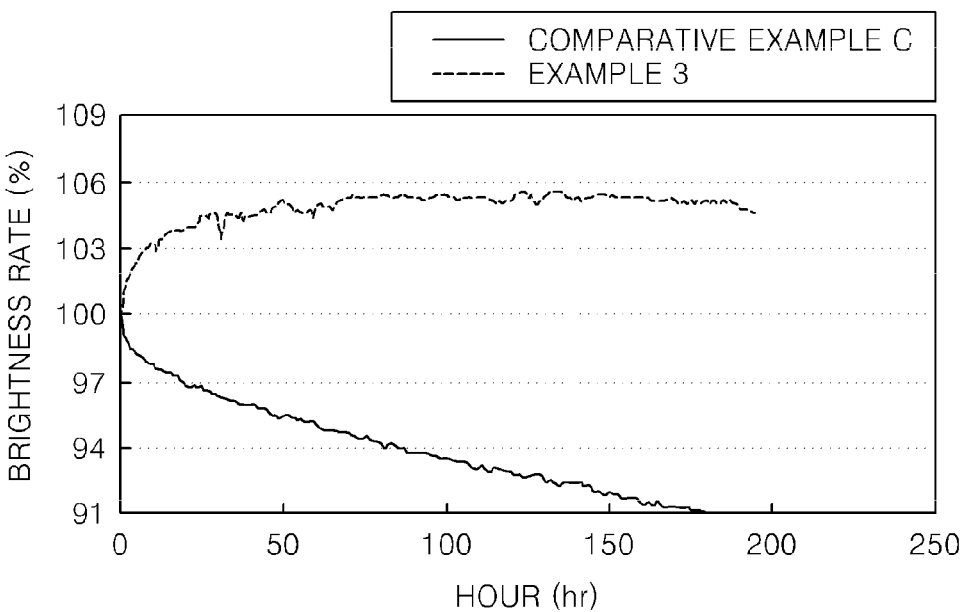

Brightness rates of OLEDs manufactured according to Examples 1, 2, and 3, and Comparative Examples A, B, and C were measured over time, and the results are shown in FIGS. 4, 5, and 6. The Y axes of FIGS. 4, 5, and 6 show brightness rates (%) with respect time, wherein the brightness at time zero (0) is 100%. The brightness was measured using a PR650 (Spectroscan) Source Measurement Unit (PhotoResearch). Referring to FIGS. 4, 5, and 6, it was identified that the OLEDs manufactured according to Examples 1, 2, and 3 had excellent lifetime characteristics. Thus, an OLED according to aspects of the present invention, may have excellent lifetime characteristics.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:
1. An organic light-emitting diode (OLED), comprising:
 a substrate;
 a first electrode formed on the substrate;
 a second electrode formed on the first electrode; and
 an electron transport layer formed between the first electrode and the second electrode, comprising a unit comprising
 a first layer comprising a first material;
 a first mixed layer formed on the first layer, comprising the first material and a second material;
 a second layer formed on the first mixed layer, comprising the second material;
 a second mixed layer formed on the second layer, comprising the first material and the second material; and
 a third layer formed on the second mixed layer, comprising the first material, wherein
 the first layer and the third layer do not include the second material and the second layer does not include the first material.
2. The OLED of claim 1, wherein the first material comprises an anthracene-based material.
3. The OLED of claim 1, wherein the first material is selected from the group consisting of Compound 5, a compound represented by Formula 1, and a compound represented by Formula 2, below:

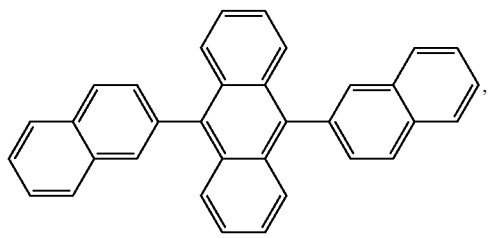

Compound 5

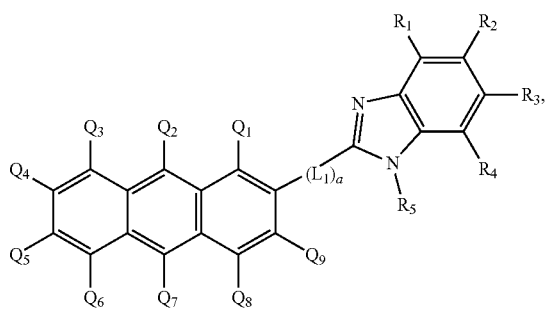

Formula 1

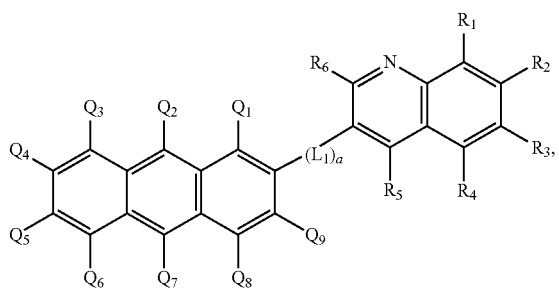

Formula 2 wherein, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, $L_1$ is a bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ hetero arylene group, $Q_1$ through $Q_9$ are each independently a hydrogen atom, a substituted or unsubstituted $C_6$-$C_{30}$ aryl group, or a substituted or unsubstituted $C_3$-$C_{30}$ hetero aryl group, and a is an integer from 1 to 10.

4. The OLED of claim 1, wherein the first material comprises Compound 5, 6, or 7 below:

Compound 5

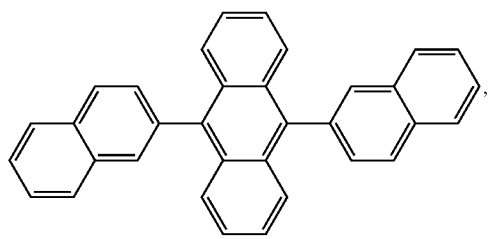

Compound 6

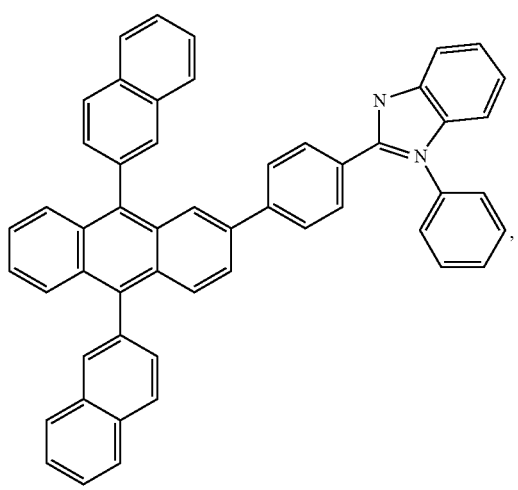

Compound 7

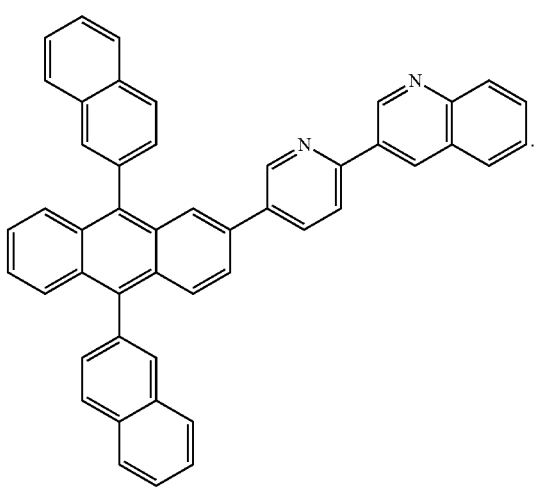

5. The OLED of claim 1, wherein the second material comprises a lithium (Li) complex.

6. The OLED of claim 1, wherein the second material comprises lithium quinolate (LiQ) or Compound 8 below:

Compound 8

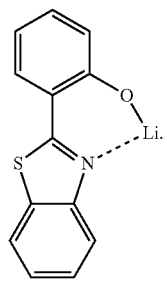

7. The OLED of claim 1, wherein the thicknesses of the first layer, the second layer, and the third layer are each independently in the range of about 0.5 nm to about 10 nm.

8. The OLED of claim 1, wherein the thicknesses of the first mixed layer and the second mixed layer are each independently in the range of about 6 nm to about 16 nm.

9. The OLED of claim 1, wherein the amount of the second material in the first mixed layer is in the range of about 30 parts by weight to about 70 parts by weight, based on 100 parts by weight of the first mixed layer; and the amount of the second material in the second mixed layer is in the range of about 30 parts by weight to about 70 parts by weight, based on 100 parts by weight of the second mixed layer.

10. The OLED of claim 1, wherein the second layer comprises two second material-containing layers; and the interface of the two second material-containing layers is indistinct.

11. The OLED of claim 1, further comprising at least one layer selected from the group consisting of a hole injection layer, a hole transport layer, an emission layer, and a hole blocking layer, formed between the first electrode and the electron transport layer.

12. The OLED of claim 1, further comprising an electron injection layer formed between the electron transport layer and the second electrode.

13. The OLED of claim 1, wherein the electron transport layer comprises two of the units disposed on one another.

14. An organic light-emitting diode (OLED), comprising:
a substrate;
a first electrode formed on the substrate;
a second electrode formed on the first electrode; and
an electron transport layer formed between the first electrode and the second electrode, comprising:
a first layer comprising a first material;
a first mixed layer formed on the first layer, comprising the first material and a second material;
a second layer formed on the first mixed layer, comprising the second material;
a second mixed layer formed on the second layer, comprising the first material and the second material;
a third layer formed on the second mixed layer, comprising the first material;
a fourth layer formed on the third layer, comprising the first material;
a third mixed layer formed on the fourth layer, comprising the first material and the second material;
a fifth layer formed on the third mixed layer, comprising the second material;
a fourth mixed layer formed on the fifth layer, comprising the first material and the second material; and
a sixth layer formed on the fourth mixed layer, comprising the first material, wherein
the first layer, the third layer, the fourth layer, and the sixth layer do not include the second material and the second layer and the fifth layer do not include the first material.

15. The OLED of claim 14, wherein the interface between the third layer and the fourth layer is indistinct.

16. The OLED of claim 14, wherein the second layer and the fifth layer respectively comprise two second material-containing layers; and the interface of the two second material-containing layers is indistinct.

* * * * *